US006455941B1

(12) United States Patent
Lee et al.

(10) Patent No.: US 6,455,941 B1
(45) Date of Patent: Sep. 24, 2002

(54) CHIP SCALE PACKAGE

(75) Inventors: Xin Hui Lee; Yi-Chuan Ding, both of Kaohsiung; Kun-Ching Chen, Tainan, all of (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/752,556

(22) Filed: Jan. 3, 2001

(51) Int. Cl.[7] .............................................. H01L 23/48

(52) U.S. Cl. ....................... 257/774; 257/781; 257/780; 257/779; 257/772; 257/737; 257/738; 257/795; 257/668

(58) Field of Search ................................. 257/781, 780, 257/773, 795, 772, 774, 737, 738, 668

(56) References Cited

U.S. PATENT DOCUMENTS 5,905,303 A * 5/1999 Kata et al. .................. 257/701
5,977,624 A 11/1999 Heo et al.

* cited by examiner

*Primary Examiner*—David L. Talbott
*Assistant Examiner*—Luan Thai

(57) ABSTRACT

A chip scale package comprises a film substrate attached to the active surface of a semiconductor chip by an adhesive layer. The adhesive layer has a plurality of apertures formed corresponding to bonding pads on the chip. The film substrate includes a film and a plurality of conductive leads formed thereon. The film has a plurality of first openings formed corresponding to the apertures of the adhesive layer and a plurality of second openings. Each lead on the film has a first end portion projecting into one of the first openings of the film and a second end portion exposed from one of the second openings of the film. Each aperture and corresponding first opening are filled with a conductive paste embedding the first end portion of one lead therein so as to electrically connect the bonding pads of the chip and the conductive leads of the film substrate. A plurality of solder bumps formed on the second end portions of leads through the second openings of the film. This invention further provides a method of making the chip scale package.

14 Claims, 4 Drawing Sheets

CHIP SCALE PACKAGE

BACKGROUND OF THE INVENTION

1. Field of the Invention

The present invention relates to a semiconductor package and a method for fabricating the same, and more particularly to a chip scale package (CSP).

2. Description of the Related Art

As electronic devices have become more smaller and thinner, the velocity and the complexity of IC chip become more and more higher. Accordingly, a need has arisen for higher package efficiency. Demand for miniaturization is the primary catalyst driving the usage of advanced packages such as chip scale packages (CSP) and flip chips. Both of them greatly reduce the amount of board real estate required when compared to the alternative ball grid array (BGA) and thin small outline package (TSOP). Typically, a CSP is 20 percent larger than the chip itself. The most obvious advantage of CSP is the size of the package; that is, the package is slightly larger than the chip. Another advantage of CSP is that the package facilitates test and burn-in before assembly as an alternative to known good die (KGD) testing. In addition, CSP can combine many of the benefits of surface mount technology (SMT), such as standardization, encapsulation, surface mount, and reworkability, with the benefits of flip chip technology, such as low inductance, high I/O count, and direct thermal path.

However, CSP has at least one disadvantage compared to conventional BGA and TSOP, namely, high cost per unit. However, this problem could be eliminated if chip-sized packages could be mass produced more easily.

Therefore, there is a need in the semiconductor packaging industry for CSP using mass production techniques at the wafer-level.

SUMMARY OF THE INVENTION

It is therefore an object of the present invention to provide a chip scale package that can be mass produced at the wafer level.

To achieve above object, the present invention provides a chip scale package comprising a film substrate attached to the active surface of a semiconductor chip by an adhesive layer. The semiconductor chip has a plurality of bonding pads formed on the active surface thereof. The adhesive layer has a plurality of apertures formed corresponding to the bonding pads of the chip. The film substrate includes a film and a plurality of conductive leads formed thereon wherein the film has a plurality of first openings formed corresponding to the apertures of the adhesive layer and a plurality of second openings. Each lead on the film has a first end portion projecting into one of the first openings of the film and a second end portion exposed from one of the second openings of the film. Each aperture and corresponding first opening are filled with a conductive paste embedding the first end portion of one lead therein so as to electrically connect the bonding pads of the chip and the conductive leads of the film substrate. A plurality of solder bumps formed on the second end portions of leads through the second openings of the film.

The present invention further provides a method for making the chip scale package at the wafer level. The method comprises the following steps of: (a) providing a film with a glue formed thereon; (b) forming a plurality of first openings at predetermined positions of the film; (c) attaching a metal foil to the film through the glue thereon and the metal foil being patterned to form the desired circuitry including a plurality of conductive leads having a first end portions and a second end portions corresponding to the first openings of the film; (d) attaching the film substrate formed in step (e) to a wafer by an adhesive layer; (e) drilling through the film and the adhesive layer simultaneously at locations corresponding to the bonding pads on the wafer such that a plurality of apertures and second openings are formed in the adhesive layer and the film, respectively; (f) filling the apertures and the second openings with a conductive paste such that the first end portions of the leads are embedded therein so as to electrically connect the bonding pads to the conductive leads; (g) forming solder bumps on the second end portions of the leads; and (h) performing a dicing operation to obtain individual chip scale packages.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 10:
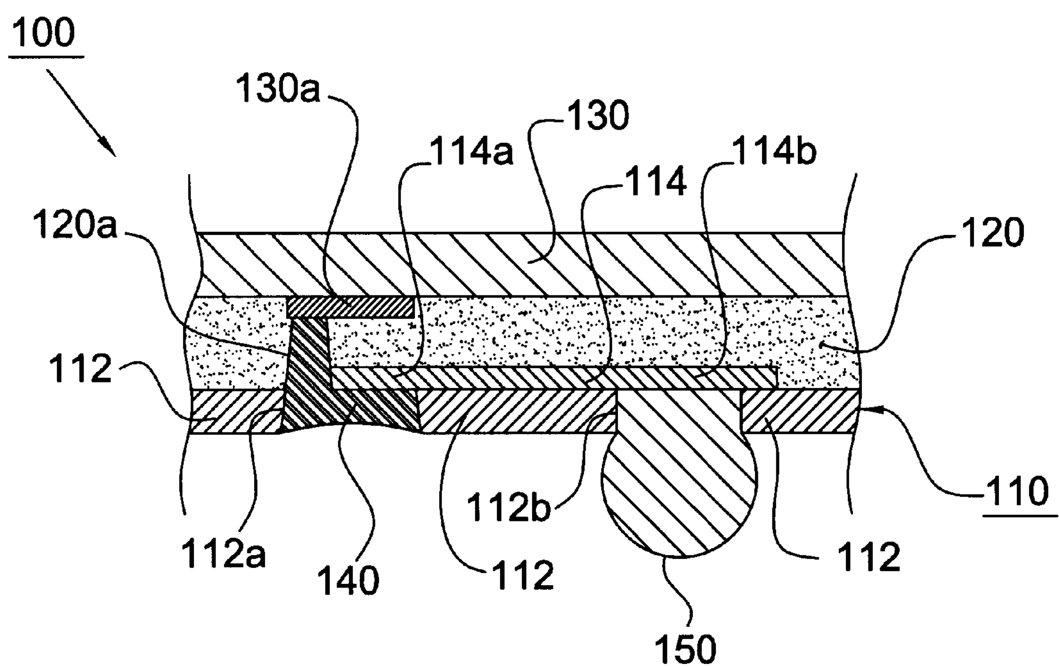
FIG. 10 is a cross-sectional view of a portion of a chip scale package according to a preferred embodiment of the present invention.

FIG. 10 shows a portion of a chip scale package 100 in accordance with a preferred embodiment of the present invention. The chip scale package 100 mainly comprises a film substrate 110 attached to the active surface of a semiconductor chip 130 by an adhesive layer 120. The semiconductor chip 130 has a plurality of bonding pads **130*a* formed on the active surface thereof for access to its inner circuits. The adhesive layer 120 has a plurality of apertures 120*a* formed corresponding to the bonding pads 130*a* of the chip 130. The film substrate 110 includes a film 112 and a plurality of conductive leads 114 formed on the film 112 wherein the film 112 has a plurality of first openings 112*a* formed corresponding to the apertures 120*a* of the adhesive layer and a plurality of second openings 112*b*. Each conductive lead 114 has a first end portion 114*a* projecting into one of the first openings 112*a* and a second end portion 114*b* exposed from one of the second openings 112*b*. Each aperture 120*a* and corresponding first opening 112*a* are filled with a conductive paste 140 embedding the first end portion 114*a* of one lead 114 therein so as to electrically connect the bonding pads 130*a* of the chip 130 and the conductive leads 114 of the film substrate 110. A solder bump 150 is formed on the second end portion 114***b* of the lead 114 through the second opening 112*b* of the film 112. The solder bumps are typically reflowed to attach the package 100 to a mounting board (not shown) such as a printed circuit board.

FIGS. 1–9 show a method of making the chip scale package 100 in accordance with the present invention.

Figure 1:
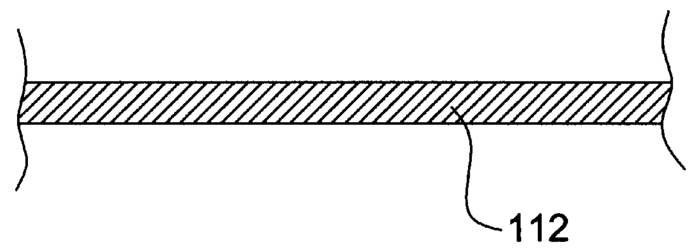
FIGS. 1–3 are used for illustrating a method of making a chip scale package in accordance with a preferred embodiment of the present invention.

FIG. 1 shows a film 110 with a glue such as a polyimide adhesive (not shown) formed thereon. Preferably, the film 110 is a polyimide film.

Figure 2:
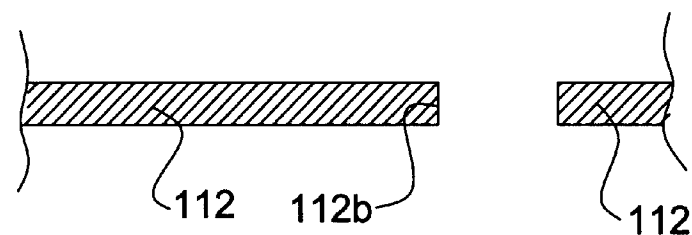

Referring to FIG. 2, the opening 112*b* can be formed at predetermined position of the film by any of a number of well-known techniques including mechanical drilling or laser drilling.

Figure 3:
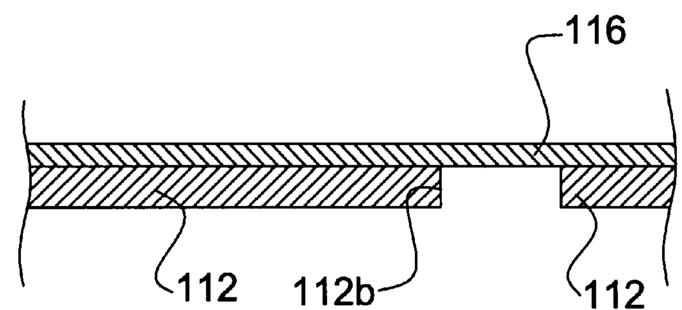

Referring to FIG. 3, a metal layer such as a copper foil 116 is attached to one side of the film 110 by the glue (not shown) thereon. Thereafter, a photoresist layer is formed over the surface of the copper foil 116 using conventional techniques and materials, then imaged and developed. As is well-known, a photomask is used to image only certain area of the photoresist layer which, when developed, are removed to leave predetermined portions of the coppers foil 116 exposed. Then the exposed portions of the copper foils 116 are etched to form the desired circuitry. Finally, the remaining photoresist is removed.

Figure 4:
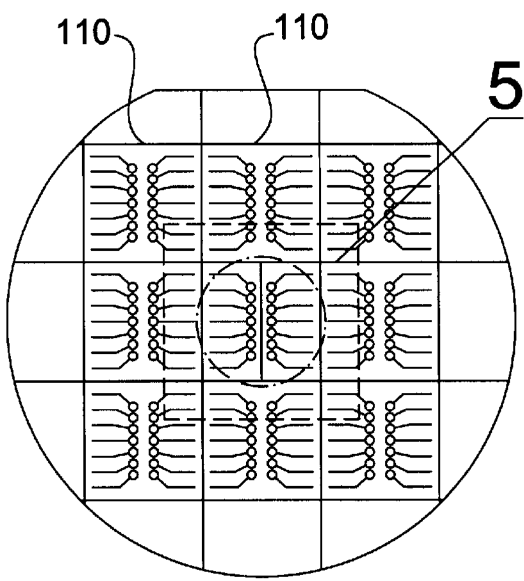
FIG. 4 is a top plan view of a plurality of film substrates of the present invention formed in a wafer-like configuration.
Figure 5:
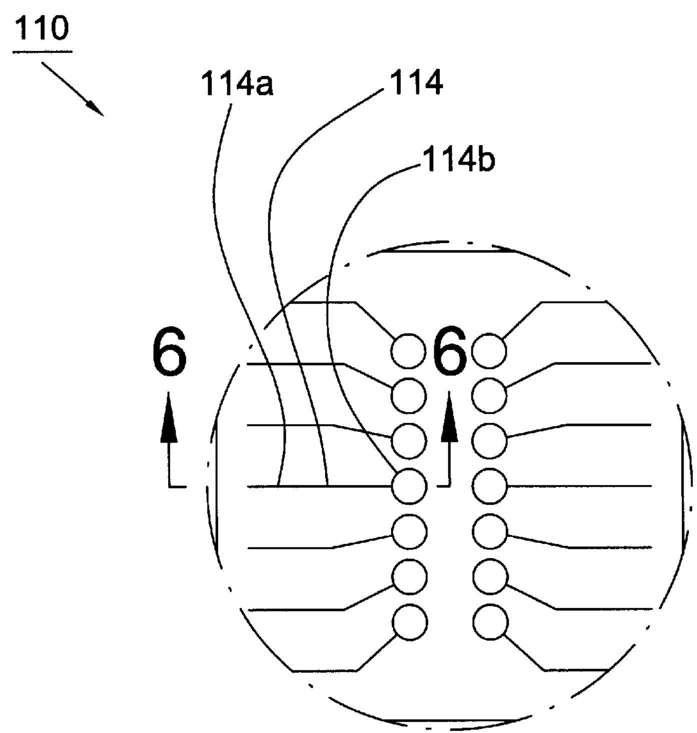
FIG. 5 illustrates, in an enlarged cross-sectional view, a film substrate of FIG. 4.
Figure 6:
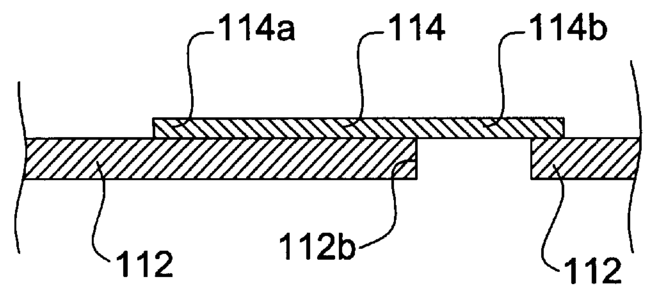
FIG. 6 is a cross sectional view taken form the line 6—6 of FIG. 5.

Referring to FIG. 5 and FIG. 6, the circuitry in accordance with the present invention comprises a plurality of conductive leads 114 having a first end portions 114*a* and a second end portions 114*b* with a circular shape. The second end portions 114*b* of the leads 114 are formed-corresponding to the openings 112*b* of the film (not shown in FIG. 5). It is noted that the chip scale package of the present invention is mass produced at the wafer level. Therefore, as shown in FIG. 4, it is desirable to integrally form a plurality of film substrates of the present invention in a wafer-like configuration which has the same size as a wafer.

Figure 7:
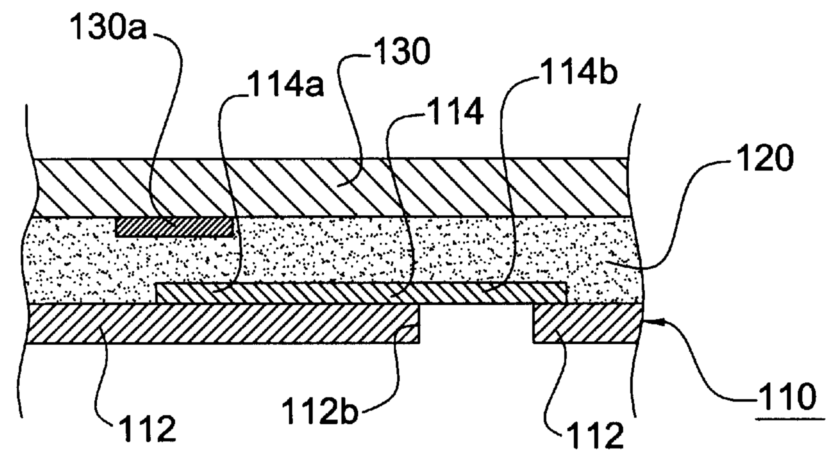
FIG. 7 is a cross-sectional view of a portion of the film substrate of FIG. 4 attached onto a wafer by an adhesive layer.

FIG. 7 is a cross-sectional view of a portion of the film substrate of FIG. 4 attached onto a wafer by an adhesive layer 120. The adhesive layer 120 is attached to the cooper trace side of the film substrate. Then, the wafer are mounted to the film substrate 110 by conventional techniques such as thermal compression.

Figure 8:
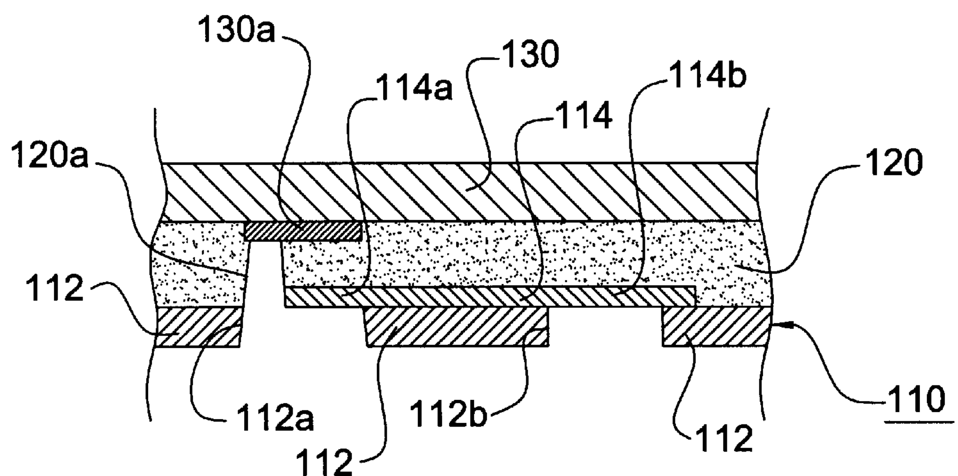
FIG. 8 and FIG. 9 are used for illustrating the method of making a chip scale package.

Referring to FIG. 8, the film 112 and the adhesive layer 120 are drilled simultaneously at the location corresponding to the bonding pad 130*a* thereby selectively forming the aperture 120*a* and the opening 112*a*. The drilling step is preferably accomplished by laser drilling because of its high selectivity, i.e., the laser selectively removes the film and the adhesive layer but leaves the lead and the bonding pad substantially intact. It can be understood that the laser beam is used to remove predetermined portions of the film 112 and the adhesive layer 120 until parts of the bonding pads 130*a* are exposed wherein the first end portion 114*a* will shelter the adhesive thereunder from the laser beam. The types of laser usable in the drilling step include carbon dioxide laser, YAG (yttrium aluminum garnet) laser, excimer laser, etc., of which carbon dioxide laser is preferred.

Figure 9:
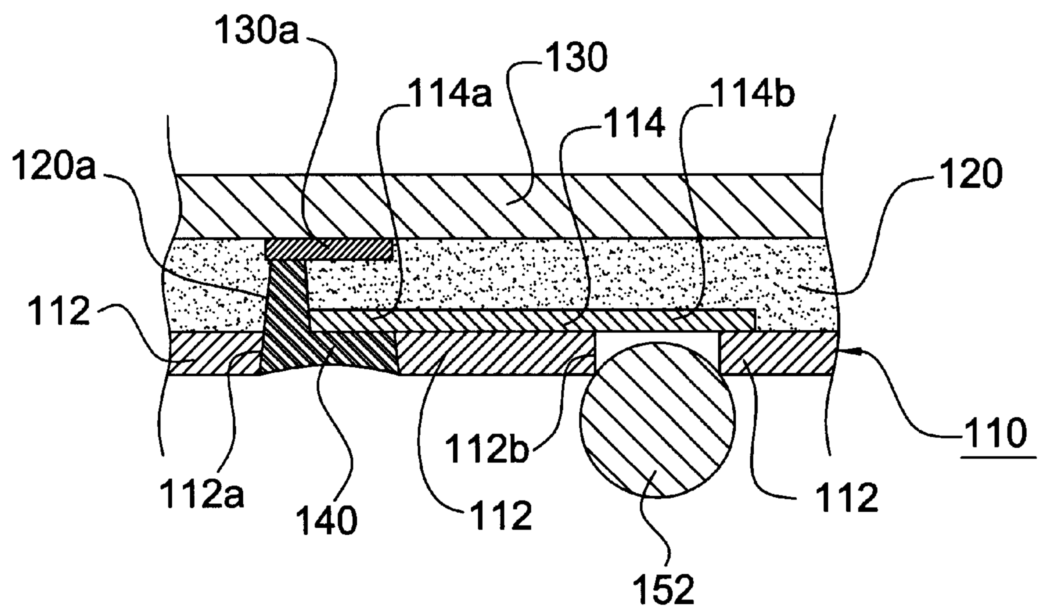

Referring to FIG. 9, the aperture 120*a* and corresponding opening 112*a* are filled with a conductive paste 140 such that the first end portion 114*a* of the lead 114 is embedded therein so as to electrically connect the bonding pad 130*a* of the chip 130 to the conductive lead 114 of the substrate 110. The conductive paste 140 may be a conductive epoxy (such as a silver paste) or a solder paste. In a preferred embodiment, the conductive paste 140 comprises Sn and 80% to 97% Pb, and most preferably 90%–95% Pb.

Then, solder balls 152 are attached to the second end portions 114*a* of the leads 114 preferably by applying a layer of sticky flux on which the balls 152 are positioned. The balls 152 may be placed simultaneously by transfer from a vacuum suction head. The flux may be It printed just on the end portions 114*a* or applied on the entire surface of the substrate 110. The balls 152 are preferably formed from Pb/Sn based solder with 20% to 75% Sn and the balance mostly Pb and most preferably is about eutectic 63% Sn and 37% Pb.

After attaching the solder balls 152 to the second end portions 114*a* of the leads 114, the solder balls 152 are reflowed into solder bumps 150 (see FIG. 10). The reflowing can be accomplished by any means known in the art. The reflowing preferably occurs at a temperature that is high enough to melt the solder ball 152 without melting a significant portion of the conductive paste 140. It could be understood that the solder bumps 150 may be formed by selectively plating, printing or dispensing.

Finally, a dicing operation is performed to obtain individual chip scale packages.

Although the invention has been explained in relation to its preferred embodiment, it is to be understood that many other possible modifications and variations can be made without departing from the spirit and scope of the invention as hereinafter claimed.

What is claimed is:

1. A chip scale package, comprising:

a semiconductor chip having a plurality of bonding pads formed on an active surface thereof;

a film substrate attached to the active surface of the semiconductor chip by an adhesive layer, the adhesive layer having a plurality of apertures formed corresponding to the bonding pads of the chip, the film substrate including a film and a plurality of conductive leads formed thereon wherein the film has a plurality of first openings formed corresponding to the apertures of the adhesive layer and a plurality of second openings, each lead having a first end portion projecting into one of the first openings of the film and a second end portion exposed from one of the second openings of the film;

each aperture and the corresponding first opening being filled with a conductive paste embedding the first end portion of the corresponding lead therein; and a plurality of solder bumps formed on the second end portions of the leads through the second openings of the film;

wherein the first end portion of each of said leads is physically spaced from the corresponding bonding pad by the adhesive layer and is electrically connected to the corresponding bonding pad via the conductive paste.

2. The chip scale package as claimed in claim 1, wherein the film of the film substrate is made of polyimide.

3. The chip scale package as claimed in claim 1, wherein the conductive paste is a conductive epoxy.

4. The chip scale package as claimed in claim 1, wherein the solder bump is formed from about 20% to about 75% Sn with most all the balance being Pb.

5. The chip scale package as claimed in claim 4, wherein the solder bump is formed from eutectic solder.

6. The chip scale package as claimed in claim 1, wherein the conductive paste includes about 80% to about 97% Pb with most all the balance being Sn.

7. The chip scale package as claimed in claim 6, wherein the conductive paste includes about 90% to about 95% Pb.

8. The chip scale package as claimed in claim 1, wherein the conductive leads are made of copper.

9. The chip scale package of claim 1, wherein the apertures and first and second openings are through vias.

10. The chip scale package of claim 1, wherein the first opening is larger in diameter than the corresponding aperture.

11. The chip scale package of claim 1, wherein the first end portion of each of said leads partially defines an inner side wall of the corresponding aperture.

12. The chip scale package of claim 1, wherein the conductive past and the first end portion of each of said leads are in electrical contact at at least two surfaces disposed at a non-zero angle with respect to each other.

13. The chip scale package of claim 12, wherein said two surfaces include a bottom surface and an end surface of the lead.

14. The chip scale package of claim 1, wherein each of said leads is physically entirely spaced from the corresponding bonding pad.

* * * * *